United States Patent
Shimoishizaka et al.

(10) Patent No.: US 7,442,074 B2
(45) Date of Patent: Oct. 28, 2008

(54) WIRING BOARD AND METHOD FOR PRODUCING THE SAME

(75) Inventors: Nozomi Shimoishizaka, Kyoto (JP); Nobuyuki Koutani, Osaka (JP); Kouichi Nagao, Kyoto (JP); Michiharu Torii, Shiga (JP); Yoshifumi Nakamura, Osaka (JP); Takayuki Tanaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 208 days.

(21) Appl. No.: 11/558,706

(22) Filed: Nov. 10, 2006

(65) Prior Publication Data

US 2007/0119614 A1    May 31, 2007

(30) Foreign Application Priority Data

Nov. 29, 2005 (JP) ............................. 2005-344276

(51) Int. Cl.
*H01R 12/24* (2006.01)
(52) U.S. Cl. ....................... 439/493; 361/749
(58) Field of Classification Search ................ 439/493, 439/518, 519, 70; 361/749–750; 174/254
See application file for complete search history.

(56) References Cited

U.S. PATENT DOCUMENTS 6,320,135 B1 * 11/2001 Saito ........................... 174/250
6,559,524 B2 * 5/2003 Seko ........................... 257/673
7,250,575 B2 * 7/2007 Nagao et al. ................. 174/254
7,336,499 B2 * 2/2008 Hagiwara .................... 361/749

FOREIGN PATENT DOCUMENTS

JP    2003-243455    8/2003

* cited by examiner

*Primary Examiner*—Phuong K Dinh
(74) *Attorney, Agent, or Firm*—Hamre, Schumann, Mueller & Larson, P.C.

(57) ABSTRACT

A wiring board includes first and second feeding electrodes (2, 3) provided along both sides of an insulating substrate (1), feeding bus lines (4) extending in a traverse direction and connected to both the feeding electrodes, and conductor wirings (6, 8, 12) having one side terminals forming inner leads having protruding electrodes (9, 11, 13) and the other side terminals connected to the feeding bus lines. The inner leads in each unit region are arranged in two lines extending in the traverse direction. The inner leads of a first group are arranged with a dense wiring pitch, and the inner leads of a second group include a dense pitch region in which a wiring pitch is the same as that of the inner leads of the first group, and a sparse pitch region in which a wiring pitch is longer than that of the inner leads of the first group. The inner leads (6) of the first group and the inner leads (12) in the dense pitch region of the second group are connected to the feeding bus line on one side of each region, and the inner leads (8) in the sparse pitch region of the second group are connected to the feeding bus line on the other side of each unit region. Non-uniformity of heights of the protruding electrodes due to a difference in the wiring pitches of the inner leads can be suppressed easily.

8 Claims, 14 Drawing Sheets

WIRING BOARD AND METHOD FOR PRODUCING THE SAME

BACKGROUND OF THE INVENTION

1. Field of the Invention

The present invention relates to a wiring board composed of a flexible and insulating substrate and conductor wirings provided thereon, such as a tape wiring board, and a method for producing the wiring board.

2. Description of the Related Art

As a type of package module that employs a tape wiring board, for example, a COF (Chip On Film) is known. In the COF, a semiconductor chip is mounted on a flexible and insulating tape wiring board, and the mounted portion is protected by sealing with a resin. The tape wiring board includes, as major elements, an insulating film substrate, and a number of conductor wirings formed on a surface thereof. In general, the film substrate is made of polyimide, and the conductor wiring is made of copper.

A major application of the COF is an implementation as a display panel driver for a liquid crystal panel or the like. In this case, conductor wirings on a tape wiring board are arranged and divided into a first group that forms external terminals for output signals, and a second group that forms external terminals for input signals, and a semiconductor chip is mounted between the two groups of conductor wirings. An example of such a tape wiring board is illustrated in FIG. 10.

FIG. 10 is a plan view of a tape wiring board including a plurality of semiconductor chip mount portions. 1 indicates a flexible and insulating substrate, and 2 and 3 indicate first and second feeding electrodes provided along both sides in a longitudinal direction of the substrate. A plurality of feeding bus lines 4 are formed, extending in a traverse direction of the insulating substrate 1, and are connected to the first and second feeding electrodes 2 and 3. Pairs of adjacent feeding bus lines 4 section the insulating substrate 1 into a plurality of unit regions, and a semiconductor chip mount portion 5 is provided in each unit region.

A plurality of conductor wirings 6, 7 and 8 are formed on the insulating substrate 1 for each unit region. Inner leads 6a, 7a and 8a formed by one-side end portions of the conductor wirings 6, 7 and 8 are arranged and aligned in the semiconductor chip mount portion 5, and the other-side end portions of the conductor wirings 6, 7 and 8 are connected to the feeding bus lines 4. The inner leads 6a, 7a and 8a are provided with protruding electrodes 9, 10 and 11, respectively. The protruding electrodes 9, 10 and 11 are arranged so as to match electrode pads of the semiconductor chip.

The inner leads 6a of the conductor wirings 6 form the first group, and the inner leads 7a and 8a of the conductor wirings 7 and 8 form the second group. The inner leads 6a of the first group and the inner leads 7a and 8a of the second group are arranged and aligned in the traverse direction of the insulating substrate 1 so that the tips of the inner leads 6a and the tips of the inner leads 7a and 8a face each other. For example, the first group is connected to the electrode pads on the output side of the semiconductor chip, and the second group is connected to the electrode pads on the input side of the semiconductor chip.

According to the tape wiring board, the electrode pads of the semiconductor chip that are divided into two groups of an input-side and an output-side facing each other, can be connected via the protruding electrodes 9, 10 and 11 to the inner lead 6a, 7a and 8a with high connection reliability. Note that, after mounting a semiconductor chip, the conductor wirings 6, 7 and 8 and the feeding bus line 4 are cut and separated from each other for use.

A method for producing a tape carrier board having the above-described configuration hereinafter will be described. Initially, an insulating substrate on a surface of which a plurality of conductor wirings are formed and aligned, is prepared. A photoresist layer is formed on an entire surface of the insulating substrate, and an elongate hole-shaped pattern (an opening) that extends across the conductor wirings is formed in the photoresist layer. Thereby, a portion of the conductor wirings is exposed in the elongate hole-shaped pattern. Next, the exposed portion of the conductor wirings in the elongate hole-shaped pattern of the photoresist is subjected to metal plating to form protruding electrodes. After removing the photoresist, a tape wiring board in which the protruding electrode is formed on the conductor wirings is obtained (see JP 2003-243455 A).

FIG. 11 illustrates the protruding electrodes formed by plating. FIG. 11 corresponds to a portion of the tape wiring board of FIG. 10, and the protruding electrodes 9, 10 and 11 are formed on the inner leads 6a, 7a and 8a, respectively.

The plating is performed using a plating apparatus as illustrated in FIG. 12. FIG. 12 is a cross-sectional view illustrating the plating apparatus schematically. The insulating substrate 1 is conveyed in a plating bath 20 by transport rollers 21a to 21f. The plating bath 20 is filled with a plating solution 22, and an anode 23 is provided in the plating bath 20. A current feeding roller 24 is provided near an inlet of the plating bath 20. The current feeding roller 24 contacts the first and second feeding electrodes 2 and 3 on the insulating substrate 1 (see FIG. 10), thereby feeding electric power. On the other hand, the current feeding roller 24 is connected to a plating power supply 26. The plating power supply 26 is connected via a first plating wiring conductor 25 to the anode 23. The plating power supply 26 supplies a first plating current $I_0$.

The current feeding roller 24 has a structure as illustrated in FIG. 13. The current feeding roller 24 comprises an insulating roller 27, and first and second ring-shaped electrodes 28 and 29 that are provided circumferentially at both end portions of the insulating roller 27 and are insulated from each other. The first ring-shaped electrode 28 of the current feeding roller 24 is caused to face and contact the first feeding electrode 2 on the insulating substrate 1, and the second ring-shaped electrode 29 is caused to face and contact the second feeding electrode 3 on the insulating substrate 1, thereby feeding electric power. The first ring-shaped electrode 28 and the second ring-shaped electrode 29 are connected together to the first plating wiring conductor 25.

The pitches of the electrode pads on a semiconductor chip are not necessarily uniform. Therefore, the intervals of the protruding electrodes on the tape carrier board have to be broadened or narrowed as illustrated in FIG. 10. The inner leads 6a of the first group in FIG. 10 have a uniform and dense wiring pitch. The inner leads of the second group include the inner leads 7a having the same dense wiring pitch as that of the inner leads 6a of the first group (dense pitch region), and the inner leads 8a having a pitch longer than that of the inner leads 6a of the first group (sparse pitch region).

Thus, when the inner lead regions have different pitches, the protruding electrodes 11 formed on the inner lead 8a in the sparse pitch region have a height higher than those of the protruding electrodes 9 and 10 formed on the inner leads 6a and 7a in the dense pitch region. When the protruding electrodes have different heights, a failure is likely to occur in a connection between the electrode pad and the protruding electrode when a semiconductor chip is mounted. The reason why a difference occurs between the heights of the protruding electrodes is that the density of a current for plating on the inner lead is higher when the wiring pitch is broad than when the wiring pitch is narrow.

SUMMARY OF THE INVENTION

An object of the present invention is to provide a wiring board that can suppress non-uniformity of heights of protruding electrodes due to a difference in wiring pitch between inner leads.

A wiring board according to the present invention includes: an insulating substrate; first and second feeding electrodes provided along both sides in a longitudinal direction of the insulating substrate; a plurality of feeding bus lines extending in a traverse direction of the insulating substrate and connected to at least one of the first and second feeding electrodes; a plurality of conductor wirings provided in each unit region defined by the feeding bus lines, one side terminals thereof forming inner leads and the other side terminals thereof being connected to the feeding bus lines; and a protruding electrode formed on each of the inner leads of the conductor wirings. The inner leads belonging to each unit region form a first group and a second group arranged in two lines extending in the traverse direction of the insulating substrate, with tips of the inner leads of the first group and tips of the inner leads of the second group facing each other. The inner leads of the first group are arranged with a dense wiring pitch, and the inner leads of the second group include a dense pitch region in which a wiring pitch thereof is the same as that of the inner leads of the first group and a sparse pitch region in which a wiring pitch thereof is longer than that of the inner leads of the first group.

To achieve the above-described object, a wiring board having a first configuration according to the present invention is characterized in that the feeding bus lines connect between the first feeding electrode and the second feeding electrode, the conductor wirings forming the inner leads of the first group and the inner leads in the dense pitch region of the second group are connected to the feeding bus line on one side of each unit region, and the conductor wirings forming the inner leads in the sparse pitch region of the second group are connected to the feeding bus line on the other side of each unit region.

A wiring board having a second configuration according to the present invention is characterized in that the feeding bus lines include first feeding bus lines connected to the first feeding electrode and second feeding bus lines connected to the second feeding electrode, the first feeding bus lines and the second feeding bus lines being arranged alternately, the conductor wirings forming the inner leads of the first group and the inner leads in the dense pitch region of the second group are connected to the first feeding bus lines, and the conductor wirings forming the inner leads in the sparse pitch region of the second group are connected to the second feeding bus line.

A method for producing a wiring board according to the present invention includes: the steps of forming first and second feeding electrodes provided along both sides in a longitudinal direction of an insulating substrate, a plurality of feeding bus lines extending in a traverse direction of the insulating substrate and connected to at least one of the first and second feeding electrodes, and a plurality of conductor wirings provided in each unit region defined by the feeding bus lines, in which inner leads are formed with one side terminals of the conductor wirings and the other side terminals thereof are connected to the feeding bus lines so that the inner leads belonging to each unit region form a first group and a second group arranged in two lines extending in the traverse direction of the insulating substrate, with tips of the inner leads of the first group and tips of the inner leads of the second group facing each other, and the inner leads of the first group are arranged with a dense wiring pitch, and the inner leads of the second group include a dense pitch region in which a wiring pitch thereof is the same as that of the inner leads of the first group and a sparse pitch region in which a wiring pitch thereof is longer than that of the inner leads of the first group; forming a photoresist on the surface on which the conductor wirings are provided, forming an opening in the photoresist, the opening extending across the inner leads and spreading over both side areas of the inner leads, to expose a portion of the inner leads in the opening; and feeding a plating current to the inner leads via the feeding bus lines from the first and second feeding electrodes, to subject the exposed portion of the inner leads to electrolytic metal plating, to form protruding electrodes.

To achieve the above-described object, a method for producing the wiring board having the first configuration of the present invention is characterized in that the conductor wirings forming the inner leads of the first group and the inner leads in the dense pitch region of the second group are connected to the feeding bus line on one side of each unit region, and the conductor wirings forming the inner leads in the sparse pitch region of the second group are connected to the feeding bus line on the other side of each unit region, and the plating current is supplied to the feeding bus lines through the first and second feeding electrodes from positions thereof on both sides with respect to the feeding bus lines in the longitudinal direction of the feeding electrodes.

A method for producing the wiring board having the second configuration of the present invention is characterized in that the feeding bus lines include first feeding bus lines extending in the traverse direction of the insulating substrate and connected to the first feeding electrode, and second feeding bus lines extending in the traverse direction of the insulating substrate and connected to the second feeding electrode, the first feeding bus lines and the second feeding bus lines being alternately arranged, the conductor wirings forming the inner leads of the first group and the inner leads in the dense pitch region of the second group are connected to the first feeding bus lines, and the conductor wirings forming the inner leads in the sparse pitch region of the second group are connected to the second feeding bus line, and the first feeding electrode and the second feeding electrode are fed with plating currents separately.

DETAILED DESCRIPTION OF THE INVENTION

Figure 1:
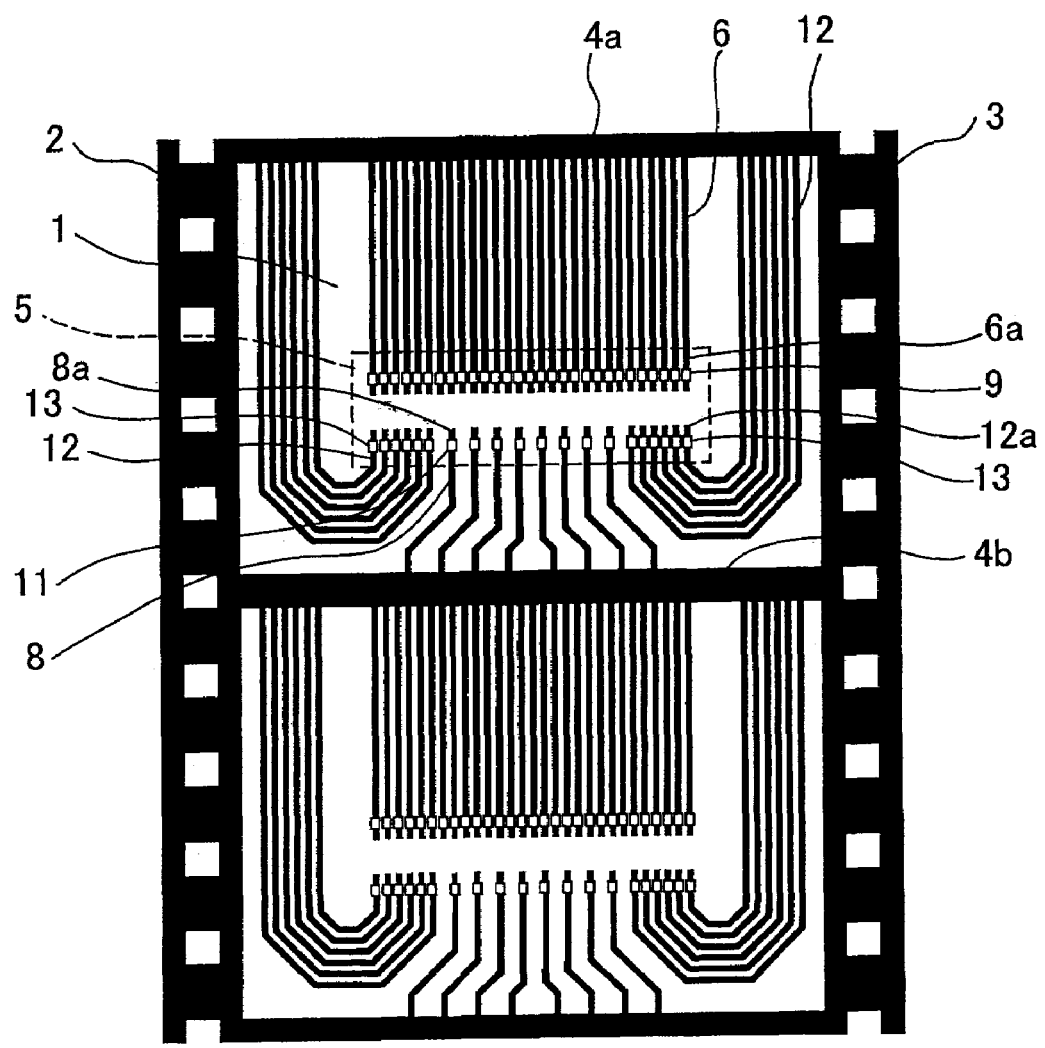
FIG. 1 is a plan view of a wiring board according to Embodiment 1 of the present invention.

According to the wiring board having the first configuration of the present invention, the conductor wirings forming the inner leads of the first group and the inner leads in the dense pitch region of the second group are connected to the feeding bus line on one side of each unit region, and the conductor wirings forming the inner leads in the sparse pitch region of the second group are connected to the feeding bus line on the other side of each unit region. Thereby, when the protruding electrode are formed by electrolytic plating, it is possible to suppress a difference in current density caused by a difference in wiring pitch between the inner leads, and increase the uniformity of heights of the protruding electrodes.

According to the wiring board having the second configuration of the present invention, the feeding bus lines include first feeding bus lines connected to the first feeding electrode and second feeding bus lines connected to the second feeding electrode, the first feeding bus lines and the second feeding bus lines being arranged alternately, the conductor wirings forming the inner leads of the first group and the inner leads in the dense pitch region of the second group are connected to the first feeding bus lines, and the conductor wirings forming the inner leads in the sparse pitch region of the second group are connected to the second feeding bus line. Thereby, when the protruding electrode are formed by electrolytic plating, it is possible to suppress a difference in current density caused by a difference in wiring pitch between the inner leads, and increase the uniformity of heights of the protruding electrodes.

In the wiring board having the first configuration, preferably, a distance from the protruding electrodes formed on the inner leads of the first group to the one feeding bus line to which the conductor wirings forming the inner leads of the first group are connected, and a distance from the protruding electrodes formed on the inner leads of the second group to the other feeding bus line, are equal to each other.

In the wiring board having the second configuration, the first feeding bus line can have a width different from that of the second feeding bus line.

Also, preferably, a distance from the protruding electrodes formed on the inner leads of the first group to the first feeding bus line, and a distance from the protruding electrodes formed on the inner leads of the second group to the second feeding bus line, are equal to each other.

According to the method for producing the wiring board having the first configuration of the present invention, the conductor wirings forming the inner leads of the first group and the inner leads in the dense pitch region of the second group are connected to the feeding bus line on one side of each unit region, and the conductor wirings forming the inner leads in the sparse pitch region of the second group are connected to the feeding bus line on the other side of each unit region, and the plating current is supplied to the feeding bus lines through the first and second feeding electrodes from positions thereof on both sides with respect to the feeding bus lines in the longitudinal direction of the feeding electrodes. Thereby, when the protruding electrodes are formed by electrolytic plating, it is possible to suppress a difference in current density caused by a difference in wiring pitch between the inner leads, and increase the uniformity of heights of the protruding electrodes.

According to the method for producing the wiring board having the second configuration of the present invention, the feeding bus lines include first feeding bus lines extending in the traverse direction of the insulating substrate and connected to the first feeding electrode, and second feeding bus lines extending in the traverse direction of the insulating substrate and connected to the second feeding electrode, the first feeding bus lines and the second feeding bus lines being alternately arranged. The conductor wirings forming the inner leads of the first group and the inner leads in the dense pitch region of the second group are connected to the first feeding bus line, and the conductor wirings forming the inner leads in the sparse pitch region of the second group are connected to the second feeding bus line, and the first feeding electrode and the second feeding electrode are fed with plating currents separately. Thereby, when the protruding electrode are formed by electrolytic plating, it is possible to suppress a difference in current density caused by a difference in wiring pitch between the inner leads, and increase the uniformity of heights of the protruding electrodes.

In the method for producing the wiring board having the second configuration of the present invention, a current feeding roller is used which has first and second ring-shaped electrodes along a circumferential surface at both end portions of an insulating roller, the first and second ring-shaped electrodes being insulated from each other. The first ring-shaped electrode of the current feeding roller is caused to face and contact the first feeding electrode on the wiring board, and the second ring-shaped electrode of the current feeding roller is caused to face and contact the second feeding electrode on the wiring board, thereby feeding the first and second feeding electrodes with plating currents separately. Thereby, it is possible to feed the first and second feeding electrodes with plating currents separately.

Hereinafter, embodiments of the present invention will be described with reference to the accompanying drawings.

EMBODIMENT 1

FIG. 1 is a plan view of a wiring board according to Embodiment 1. The basic structure of the wiring board of FIG. 1 is similar to the conventional example of FIG. 10. The same elements are indicated by the same reference numerals.

On a flexible and insulating substrate 1, first and second feeding electrodes 2 and 3 are formed, extending along both side edges in a longitudinal direction thereof. A plurality of feeding bus lines 4a, 4b are formed, extending in a traverse direction of the insulating substrate 1, and are connected to the first and second feeding electrodes 2 and 3. The feeding bus lines 4a, 4b section the insulating substrate 1 into a plurality of unit regions. A semiconductor chip mount portion 5 is provided in each unit region.

A plurality of conductor wirings 6, 8 and 12 are formed on the insulating substrate 1 for each unit region. Inner leads 6a, 8a and 12a formed by one-side end portions of the conductor wirings 6, 8 and 12 are arranged and aligned in the semiconductor chip mount portion 5. The other-side end portions of the conductor wirings 6, 8 and 12 are connected to the feeding bus line 4. Protruding electrodes 9, 11 and 13 are formed on the inner leads 6a, 8a and 12a, respectively. The protruding electrodes 9, 11 and 13 are arranged so as to match electrode pads of a semiconductor chip.

The inner leads 6a of the conductor wirings 6 provided on an upper side in FIG. 1 of the semiconductor chip mount portion 5 form a first group, and the inner leads 8a and 12a of the conductor wirings 8 and 12 provided on a lower side in FIG. 1 of the semiconductor chip mount portion 5 form a second group. The inner leads 6a of the first group and the inner leads 8a and 12a of the second group are arranged and aligned in the traverse direction of the insulating substrate 1 so that the tips of the inner leads 6a and the tips of the inner leads 8a and 12a face each other. For example, the first group is connected to electrode pads on the output side of the semiconductor chip, and the second group is connected to electrode pads on the input side of the semiconductor chip.

The inner leads 6a of the first group have a uniform and dense wiring pitch (an interval between each conductor wiring is uniform and narrow). Of the inner leads of the second group, the inner leads 12a form a dense pitch region having the same wiring pitch as that of the inner leads 6a of the first group. The inner leads 8a form a sparse pitch region having a wiring pitch longer than that of the inner leads 6a of the first group.

Figure 10:
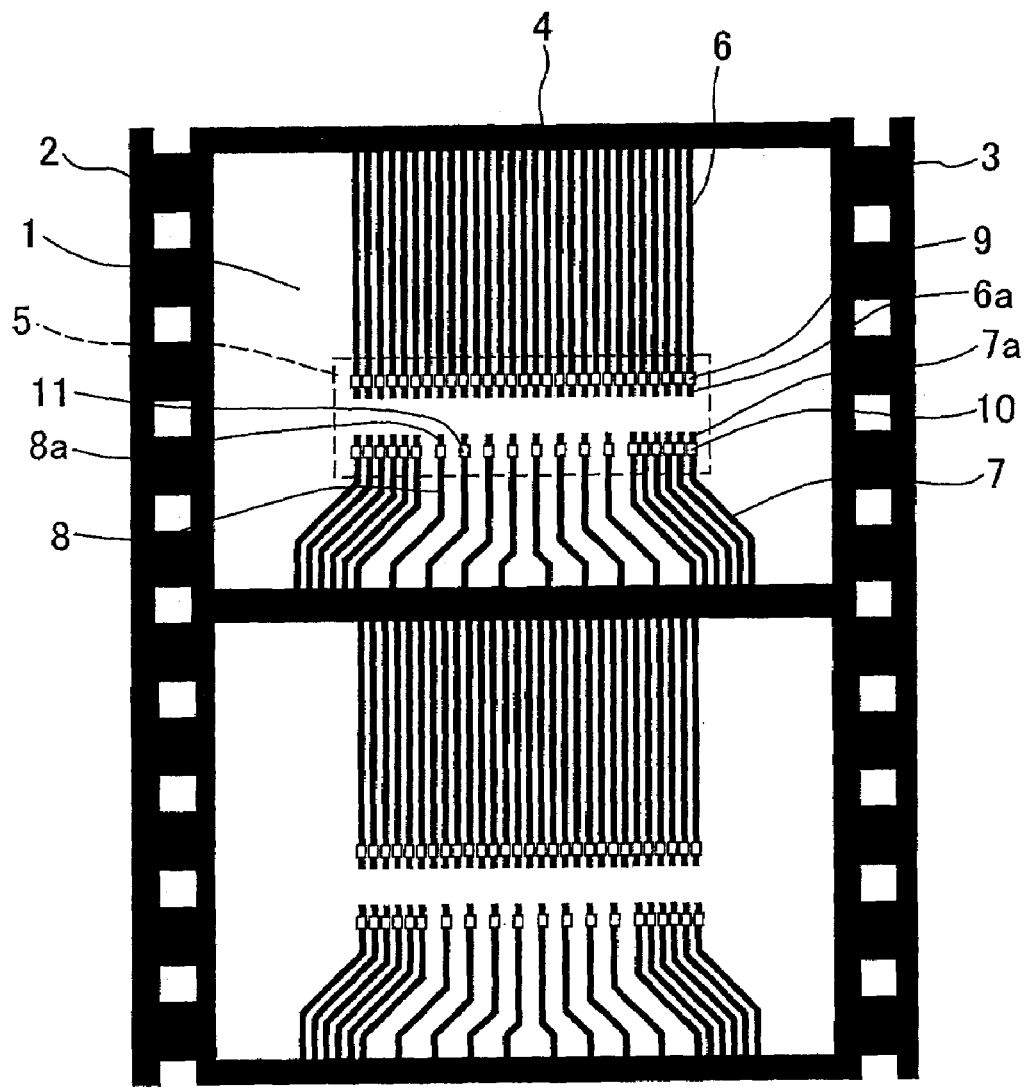
FIG. 10 is a plan view of a conventional wiring board.
Figure 11:
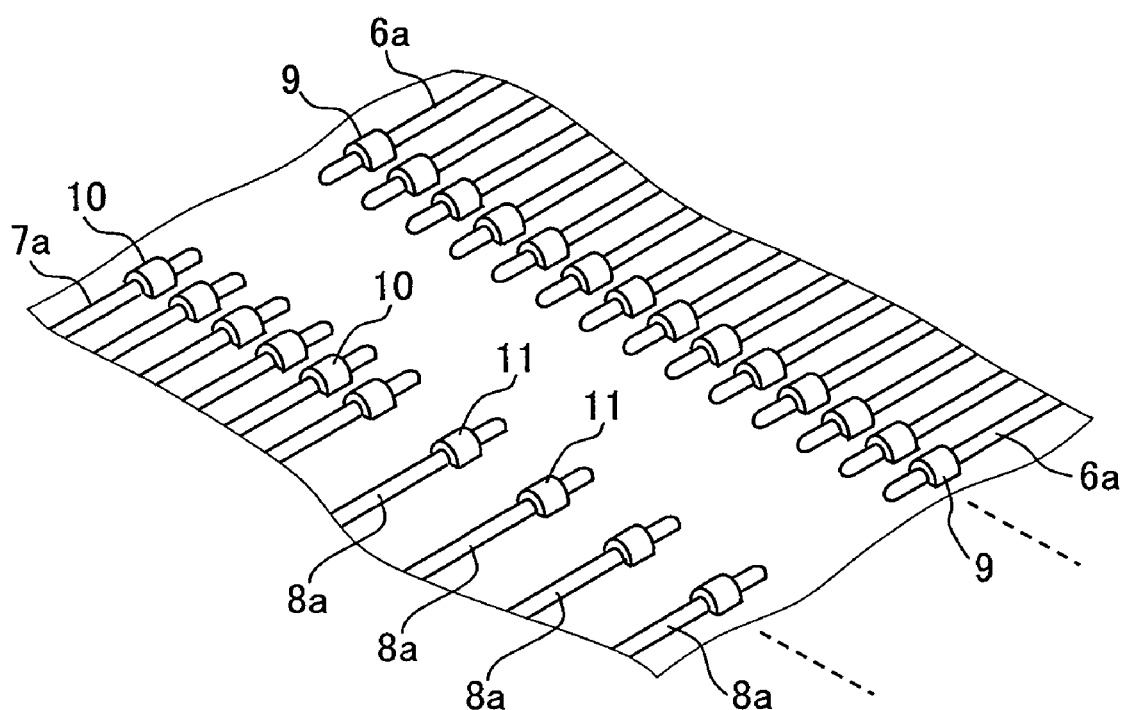
FIG. 11 is a perspective view illustrating conductor wirings and protruding electrodes formed on the wiring board.

In this embodiment, the inner leads 12a have a connection form with respect to the feeding bus line 4a, 4b, that is different from that of the conventional example of FIG. 10. Specifically, the conductor wirings 12 forming the inner leads 12a in the dense pitch region of the second group as well as the conductor wirings 6 forming the inner leads 6a of the first group are connected to the upper feeding bus line 4a. The conductor wirings 8 forming the inner leads 8a in the sparse pitch region of the second group are connected to the lower feeding bus line 4b.

According to this embodiment, the inner leads 6a and 12a having the dense pitch and the inner leads 8a having the sparse pitch are connected to the upper feeding bus line 4a and the lower feeding bus line 4b, respectively and separately. Thereby, it is possible to suppress a difference in height between the protruding electrodes which are formed by electrolytic plating, which otherwise is caused by a difference in pitch between the inner lead regions. This is based on the use of a gradient of plating current density in the longitudinal direction of the insulating substrate 1. Specifically, a difference in power feeding current occurring between the upper feeding bus line 4a and the lower feeding bus line 4b is adjusted so as to cancel a difference in plating current density between the inner leads 6a and 12a connected to the upper feeding bus line 4a and the inner leads 8a connected to the lower feeding bus line 4b, which is caused by the difference in wiring pitch. The reason why such adjustment can be performed will be hereinafter described.

Figure 2:
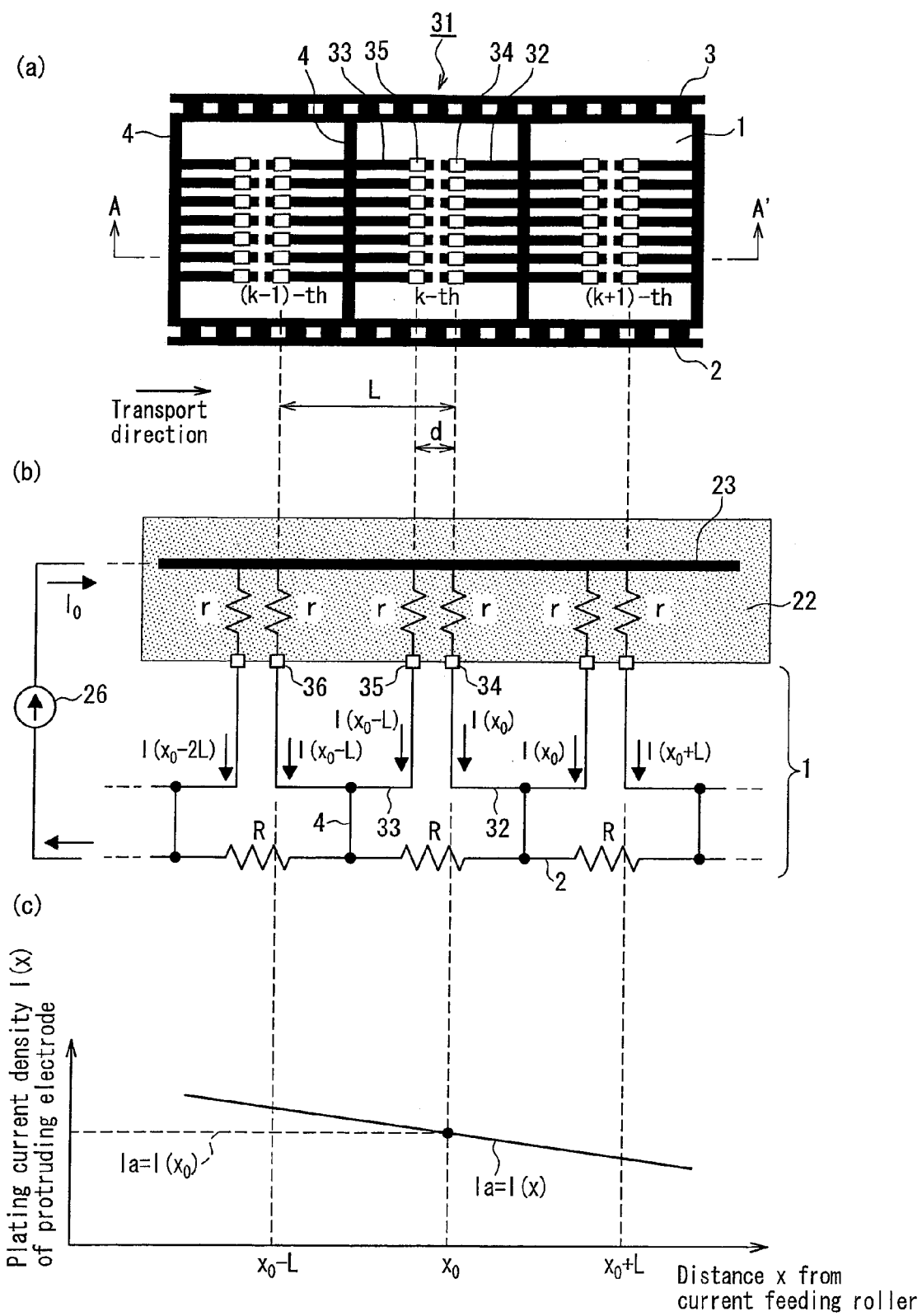
FIG. 2 is a diagram for describing an operation when protruding electrodes are formed on a wiring board, and (a) is a plan view of the wiring board, (b) is an equivalent circuit diagram of a system for plating, including the wiring board, and (c) is a graph indicating a process of plating formation.
Figure 12:
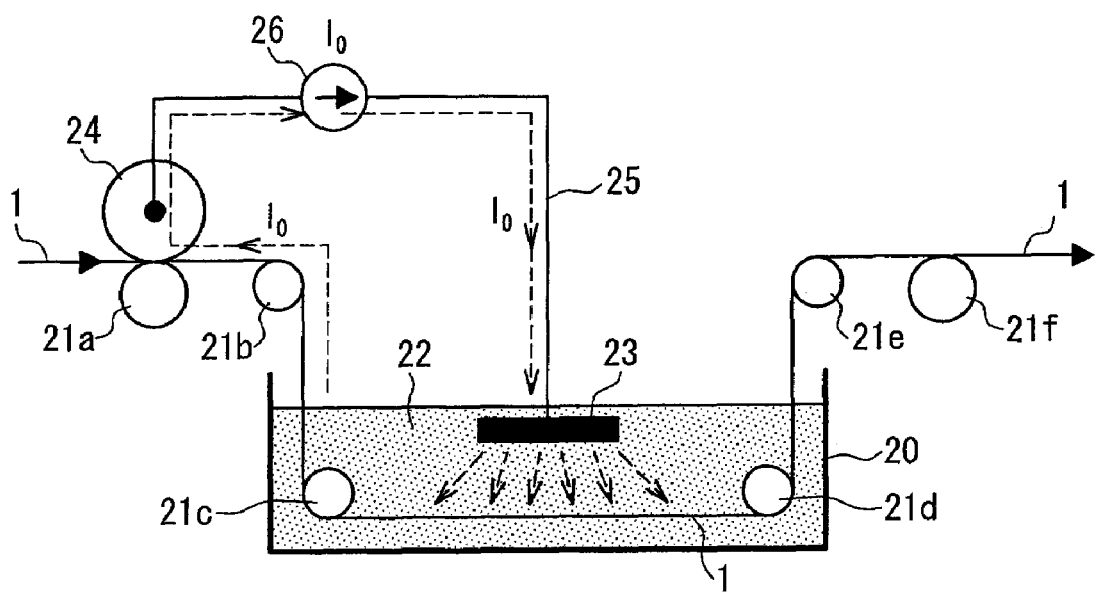
FIG. 12 is a schematic cross-sectional view illustrating a conventional plating apparatus for forming protruding electrodes on a wiring board.

FIG. 2(a) illustrates a wiring board 31 when electrolytic plating is being performed using the apparatus of FIG. 12. Unit regions having the same shape are continuously formed with a pitch L on the wiring board 31. FIG. 2(a) illustrates (k−1)-th, k-th, and (k+1)-th unit regions counted from the current feeding roller. During electrolytic plating, an insulating substrate 1 is conveyed from the left to the right of FIG. 2. In FIG. 2(a), the insulating substrate 1, a first feeding electrode 2, a second feeding electrode 3, and feeding bus lines 4 are similar to those of FIG. 10. Here, for the sake of simplicity, conductor wirings 32 of a first group and conductor wirings 33 of a second group are shown to have the same wiring width, wiring pitch and wiring length. First protruding electrodes 34 formed on the conductor wirings 32 of the first group and second protruding electrodes 35 formed on the conductor wirings 33 of the second group are distinguished from each other for the purpose of illustration. A gap between the first protruding electrodes 34 and the second protruding electrodes 35 facing each other is represented by "d".

FIG. 2(b) illustrates an electrical equivalent circuit of a cross-section taken along line A-A' of FIG. 2(a). A plating solution 22, an anode 23, and a plating power supply 26 are similar to those of FIG. 12. A cathode side of the plating power supply 26 is connected via the current feeding roller 24 (not shown in FIG. 2) to the first feeding line 2. An anode side of the plating power supply 26 is connected to the anode 23. An equivalent electrical resistance of the plating solution 22 between the protruding electrodes 34 and 35 and the anode 23 is represented by "r", and a conductor resistance of the first feeding electrode 2 between the two feeding bus lines 4 is represented by "R".

Here, for the sake of simplicity, the electrical resistances of the feeding bus line 4, the conductor wirings 32 and 33, and the anode 23 are assumed to be zero. Also, the first and second protruding electrodes 34 and 35 are assumed to have the same plating area. By supplying a sufficient amount of ions in the plating solution 22 by means of, for example, stirring of the plating solution 22, the equivalent electrical resistance r of the plating solution 22 between the first and second protruding electrodes 34 and 35 and the anode 23 is assumed to have a constant value no matter where the protruding electrodes are provided.

FIG. 2(c) illustrates a plating current Ia flowing through the first protruding electrode 34 where the horizontal axis represents a distance "x" from the current feeding roller 24 to the first protruding electrode 34. As the distance x from the current feeding roller 24 to the first protruding electrode 34 is increased due to an influence of the conductor resistance R of the feeding electrode 2 (the current feeding roller 24 is further away from the protruding electrode 34), the plating current Ia of the protruding electrode 34 decreases.

Here, when the distance $x=x_0$ (k-th location), the plating current Ia of the first protruding electrode 34 is represented by:

$$Ia_{(k)} = I(x_0) \tag{1}$$

Similarly, when the distance $x=x_0-L$ ((k−1)-th location), the plating current Ia of the protruding electrode 36 is represented by:

$$Ia_{(k-1)} = I(x_0-L) \tag{2}$$

Thus, $$I(x_0-L) > I(x_0) \tag{3}$$

Figure 3:
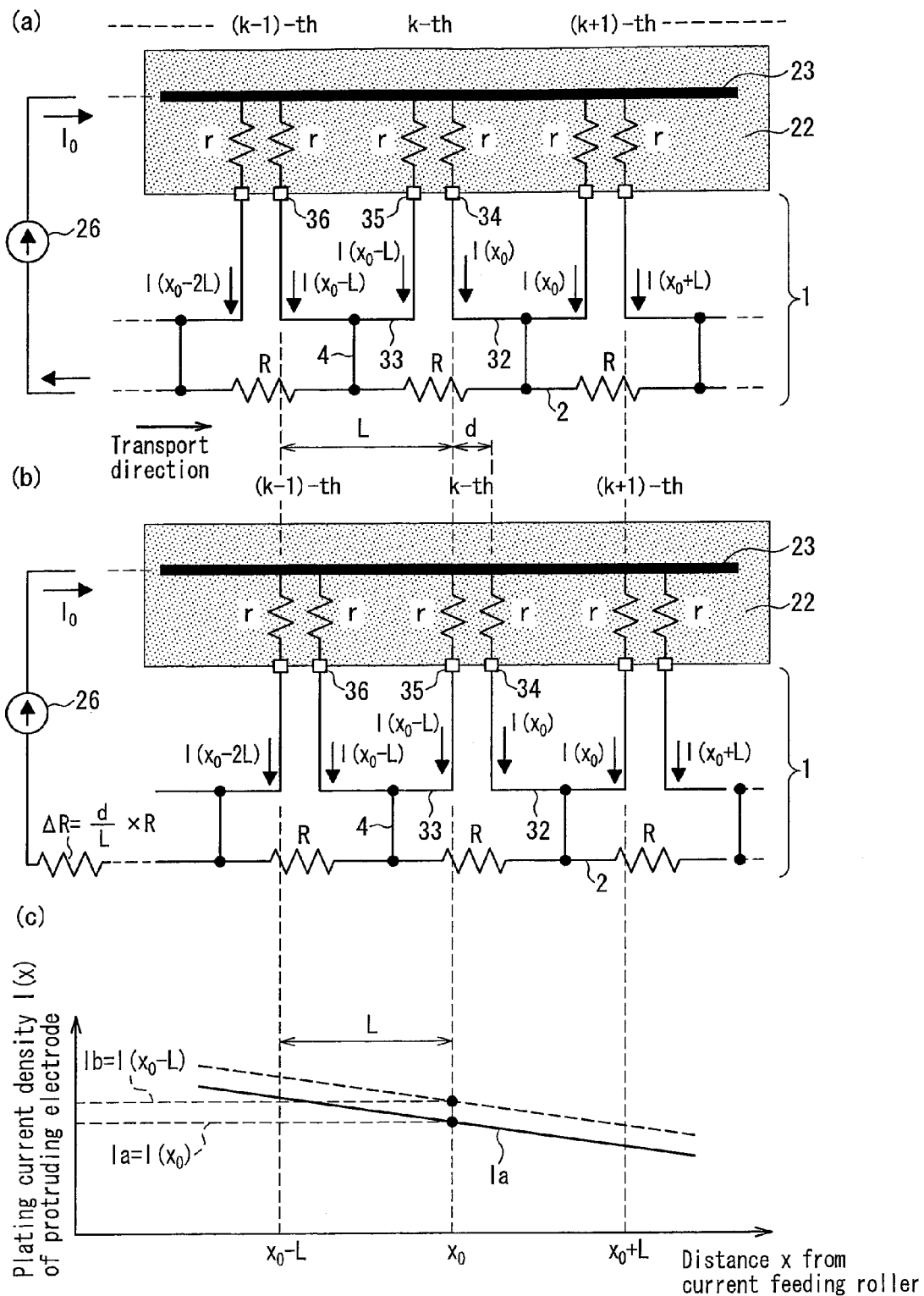
FIG. 3 is a diagram illustrating another process for describing an operation when the protruding electrodes are formed, and (a) and (b) are equivalent circuit diagrams of the system for plating, and (c) is a graph indicating the process of plating formation.

Next, a relationship between the plating current Ia of the first protruding electrode 34 and a plating current Ib of the second protruding electrode 35 will be described with reference to FIG. 3. FIG. 3(a) is the same as FIG. 2(b), i.e., is a diagram illustrating the case where the k-th first protruding electrode 34 is located at the distance $x_0$. FIG. 3(b) is different from FIG. 3(a) in that the insulating substrate 1 is shifted to the right by the gap d between the first protruding electrode 34 and the second protruding electrode 35, and the k-th second protruding electrode 35 is located at the distance $x_0$.

Initially, the plating current Ia of the k-th first protruding electrode 34 of FIG. 3(b) is calculated. In the case of a general tape board for a liquid crystal driver application, L is set to be about 10 mm to about 50 mm in consideration of the flexibility, wiring density, cost and the like of the tape board. The gap d between the first protruding electrode 34 and the second protruding electrode 35 facing each other is equal to a distance between electrodes of a semiconductor chip mounted on the wiring board, i.e., generally, about 0.7 mm to about 1.5 mm. $x_0$ is generally 500 mm to 2000 mm due to the structure of the plating bath 20.

Therefore, it is assumed here that L=25 mm, d=1 mm, and $x_0$=1000 mm. In FIG. 3(a), a resistance of the feeding electrode from the current feeding roller 24 to the distance $x_0$ is represented by $R_0$:

$$R_0=(x_0/L) \times R=40 \times R \quad (4).$$

Also, in FIG. 3(b), the amount of increase in conductor resistance of the first feeding electrode 2 occurring when the insulating substrate 1 is shifted by d to the right, is represented by ΔR:

$$\Delta R=(d/L) \times R=0.04 \times R \quad (5).$$

According to expressions (4) and (5), $$\Delta R=0.001 \times R_0 \quad (6).$$

When $d \ll x_0$ as in expression (6), the amount ΔR of increase in conductor resistance of the first feeding electrode 2 is considerably smaller than the resistance $R_0$ of the feeding electrode 2 from the current feeding roller 24 to the distance $x_0$, so that the plating current Ia of the k-th first protruding electrode 34 does not substantially change (FIG. 3(b)) from a state before the insulating substrate 1 is shifted (FIG. 3(a)), as is indicated by expression (1).

Similarly, the plating current Ia of the protruding electrode 36 in the (k−1)-th unit region is represented by expression (2).

Next, a change in the plating current Ib of the second protruding electrode 35 in the k-th unit region when the insulating substrate 1 is shifted by d to the right, is calculated.

In FIG. 3(b), as described above, when it is assumed that the equivalent electrical resistance r of the plating solution 22 has a constant value irrespective of the location, the k-th second protruding electrode 35 and the (k−1)-th first protruding electrode 36, which are connected to the same k-th first feeding bus line 4, have the same plating current, i.e., the plating current $Ib_{(k)}$ is equal to the plating current $Ia_{(k-1)}$.

$$Ia_{(k-1)}=Ib_{(k)}=I(x_0-L) \quad (7).$$

In this case, the k-th second protruding electrode 35 is located at $x_0$.

According to expressions (1), (3) and (7) above, a relationship between the plating current $Ia_{(k)}$ of the first protruding electrode 34 at the location $x_0$ and the plating current $Ib_{(k)}$ of the second protruding electrode 35 is represented by:

$$Ib_{(k)}=I(x_0-L)>Ia_{(k)}=I(x_0) \quad (8).$$

Therefore, as illustrated in FIG. 3(c), when $d \ll x_0$, $$Ib_{(x)}>Ia_{(x)} \quad (9).$$

Figure 4:
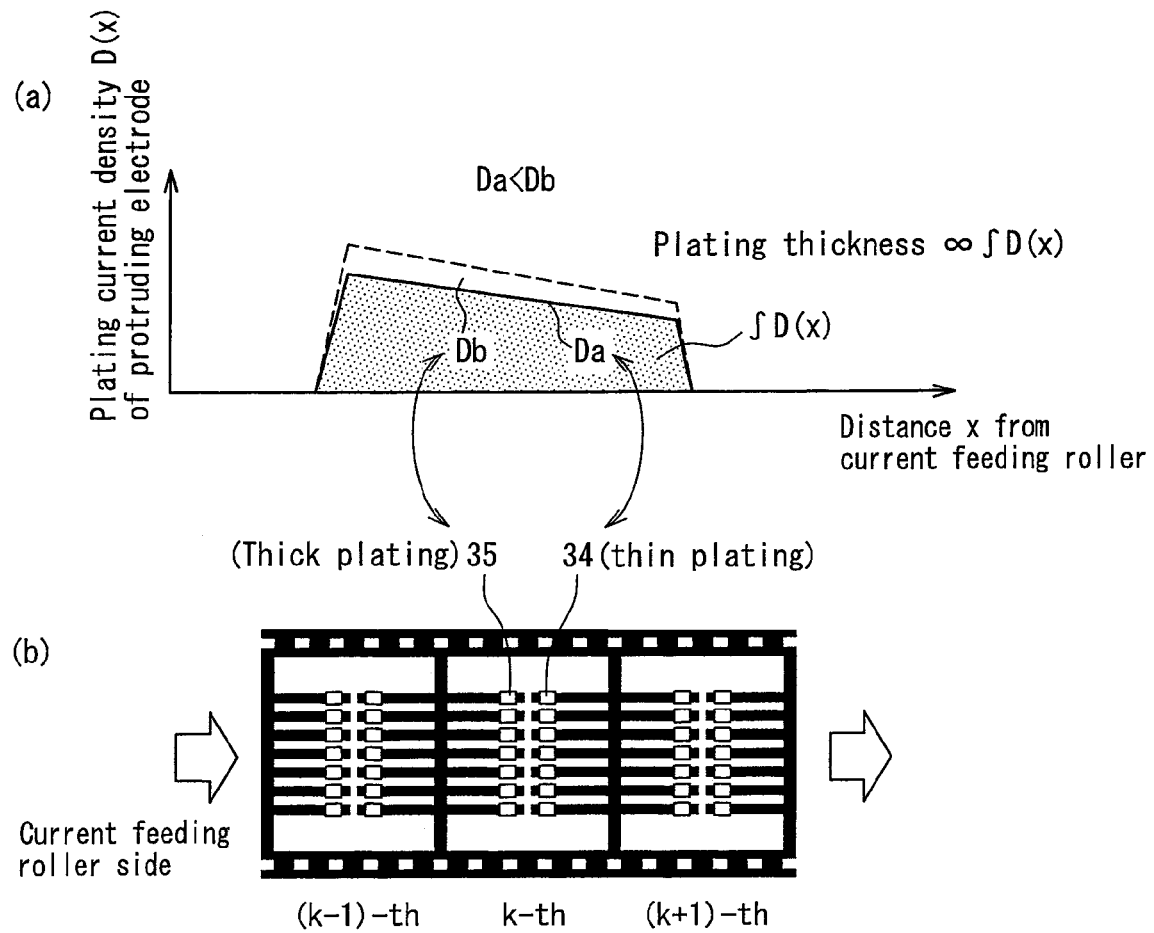
FIG. 4 is a diagram for describing an operation when the protruding electrodes are formed, and (a) is a graph indicating an integral of a plating current flowing through the protruding electrode with respect to a distance x from a current feeding roller to the protruding electrode, and (b) is a plan view of a wiring board.

Next, the relationship between the first protruding electrode 34 and the second protruding electrode 35, and the plating current density will be described with reference to the plating apparatus of FIG. 12, and FIG. 4. FIG. 4(a) illustrates an integral value of a plating current flowing through the protruding electrode, where the horizontal axis represents the distance x from the current feeding roller 24 to the protruding electrode. FIG. 4(b) illustrates the same wiring board as that of FIG. 2(a) for the purpose of ease of comparison with FIG. 4(a).

Assuming that the first protruding electrode 34 and the second protruding electrode 35 have the same plating area, a plating current density of the first protruding electrode 34 at the distance x is represented by Da(x), and a plating current density of the second protruding electrode 35 at the distance x is represented by Db(x).

In this case, since the plating currents Ib and Ia have the relationship of expression (9), the plating current densities Db and Da have the following relationship.

$$Db(x)>Da(x) \quad (10)$$

As indicated in FIG. 4(a), when the insulating substrate 1 is conveyed away from the current feeding roller 24 with constant speed, a plating thickness is proportional to an integral of the current density with respect to the distance x. Therefore, in the case where the board of FIG. 4(b) is plated using the production apparatus of FIG. 12 based on the plating current density distribution of FIG. 4(a), the plating thickness of the second protruding electrode 35 closer to the current feeding roller 24 becomes larger than the plating thickness of the first protruding electrode 34 farther from the current feeding roller 24 even when the second protruding electrode 35 and the first protruding electrode 34 are located at the same k-th location.

It should be noted that such a result is caused since the plating currents Ia and Ib for the first protruding electrode 36 and the second protruding electrode 35 connected to the same feeding bus line 4 are equal to each other, as indicated in expression (7) and FIG. 3(b).

A method of adjusting a potential gradient occurring in the longitudinal direction of the insulating substrate 1 as described above by improving the form of feeding power will be described with reference to FIGS. 5A and 5B.

Figure 5A:
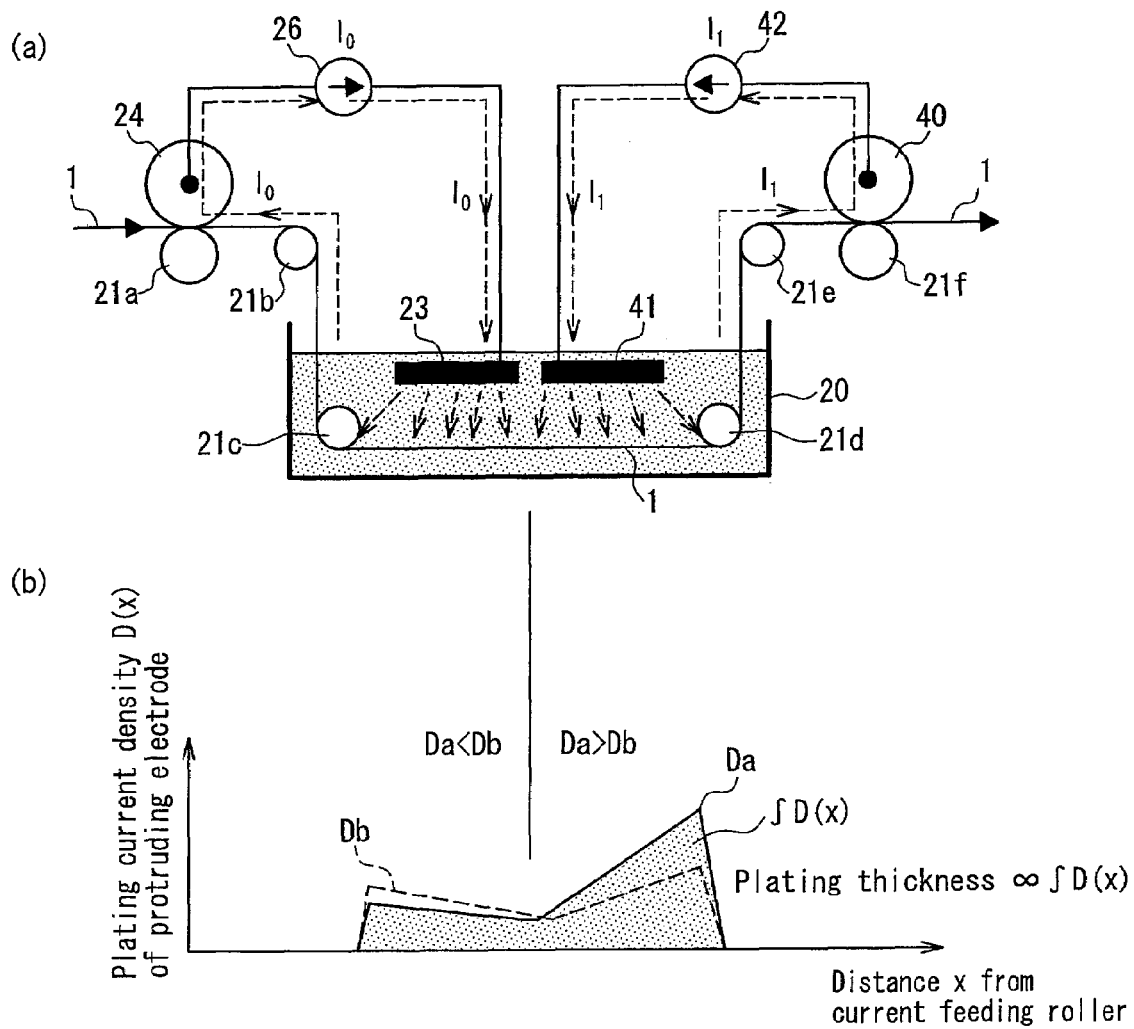
FIG. 5A is a diagram for describing an advantage of the wiring board of Embodiment 1 of the present invention, and (a) is a schematic cross-sectional view of a plating apparatus, and (b) is a graph indicating a process of plating formation.

FIG. 5A (a) is an improved version of the plating apparatus of FIG. 12. A second current feeding roller 40, a second anode 41, and a second plating power supply are added to the apparatus of FIG. 12. FIG. 5A (b) illustrates an integral value of a plating current flowing through the protruding electrode, where the horizontal axis represents the distance x at the protruding electrode from the current feeding roller 24.

In the case of this apparatus, as illustrated in FIG. 5A (b), the magnitudes of the plating current density Da for the first protruding electrode 34 and the plating current density Db for the second protruding electrode 35 are reversed at a boundary between the anode 23 and the second anode 41, i.e., Da<Db under the anode 23 and Db>Da under the anode 41, which could be inferred readily based on the discussion of FIG. 4.

Figure 5B:
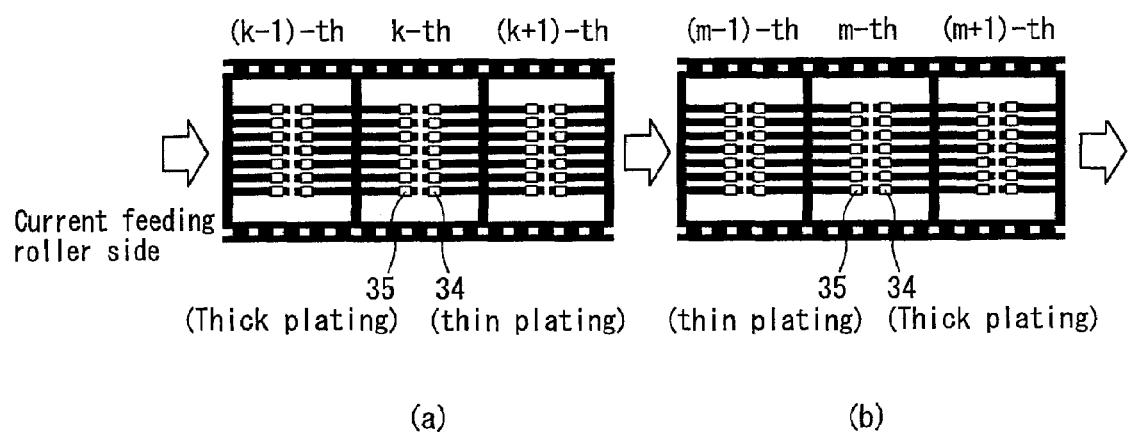
FIG. 5B is a plan view for describing a state of the protruding electrodes on the wiring board.

Therefore, under the anode 23 as illustrated in FIG. 5B (a), the plating thickness of the second protruding electrode 35 grows larger than the plating thickness of the first protruding electrode 34, and under the second anode 41 as illustrated in FIG. 5B (b), the plating thickness of the first protruding electrode 34 grows larger than the plating thickness of the second protruding electrode 35. As illustrated in FIG. 5A (b), a total plating thickness is proportional to an integral of the current density with respect to the distance x. Therefore, based on a ratio of a plating current $I_0$ and a second plating current $I_1$, the total plating thickness of the first protruding electrode 34 and the second protruding electrode 35 can be adjusted.

Specifically, a relationship between a plating thickness t1 of the first protruding electrode 34 and a plating thickness t2 of the second protruding electrode 35 is t1>t2 when $I_0$>$I_1$, and t1<t2 when $I_0$<$I_1$.

As described above, in the manufacturing apparatus of FIG. 5A (a), the relationship in plating thickness between the protruding electrodes connected to the different feeding bus lines can be adjusted by adjusting the plating current $I_0$ and the second plating current $I_1$. In addition, as described above, by connecting the inner leads 6a and 12a having the dense pitch to the upper feeding bus line 4a and connecting the inner leads 8a having the sparse pitch to the lower feeding bus line 4b, respectively and separately, it is possible to suppress a difference in height between protruding electrodes formed by electrolytic plating, which is otherwise caused due to a difference in pitch between inner lead regions.

EMBODIMENT 2

Figure 6:
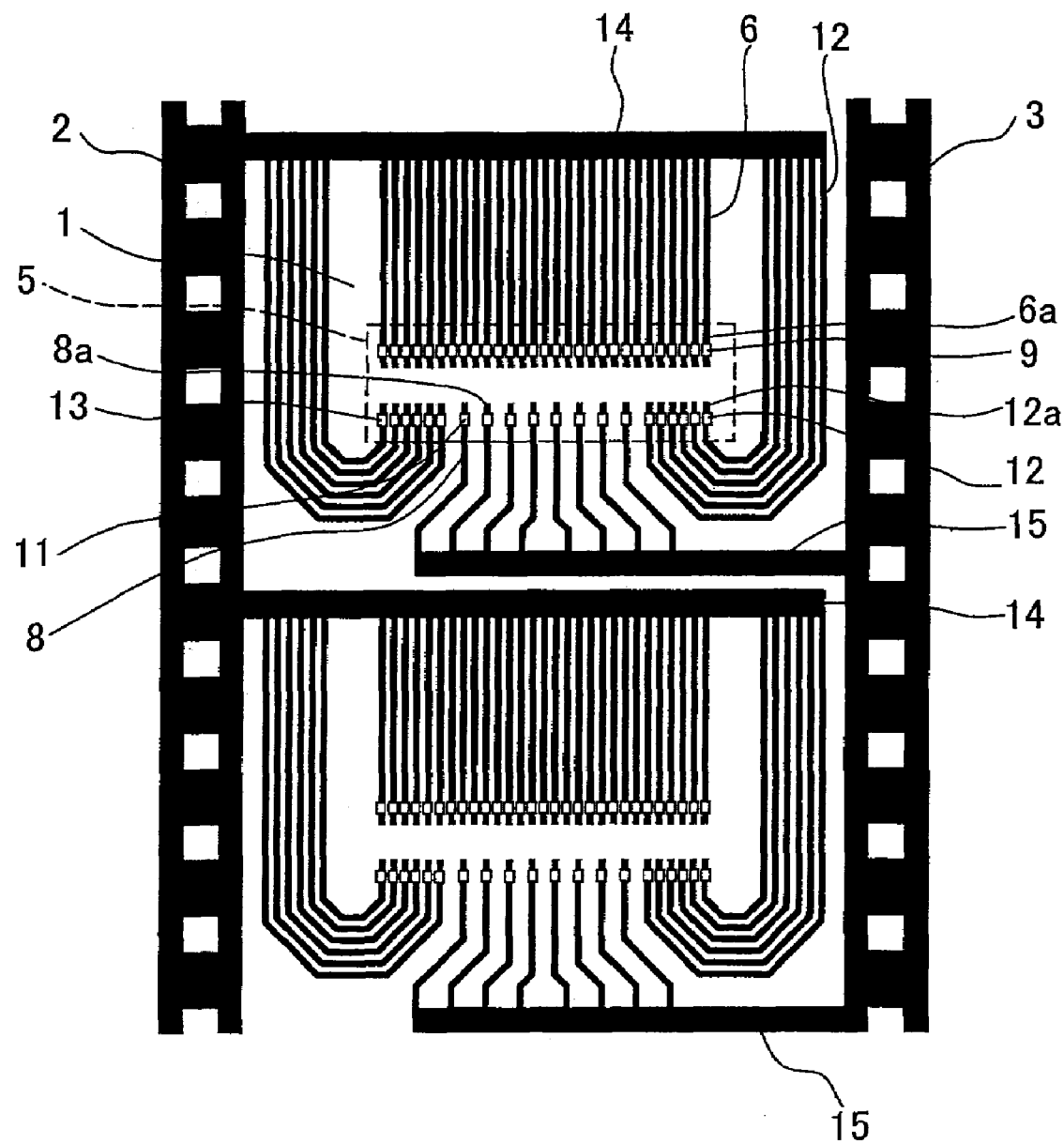
FIG. 6 is a plan view of a wiring board according to Embodiment 2 of the present invention.

FIG. 6 is a plan view of a wiring board according to Embodiment 2. The same parts as those of the wiring board of Embodiment 1 of FIG. 1 are indicated by the same reference numerals and the explanation thereof will not be repeated.

In this embodiment, there are two kinds of feeding bus lines, i.e., first feeding bus lines 14 and second feeding bus lines 15. The first feeding bus line 14 extends in a traverse direction of the insulating substrate 1, is connected to the first feeding electrode 2, but is not connected to the second feeding electrode 3. The second feeding bus line 15 extends in the traverse direction of the insulating substrate 1, is connected to the second feeding electrode 3, but is not connected to the first feeding electrode 2. The first and second feeding bus lines 14 and 15 section the insulating substrate 1 into unit regions.

The conductor wirings 6 and 12 forming the inner leads 6a of the first group and the inner leads 12a in the dense pitch region of the second group are connected to the first feeding bus line 14. The conductor wirings 8 forming the inner leads 8a in the sparse pitch region of the second group are connected to the second feeding bus line 15.

Figure 7:
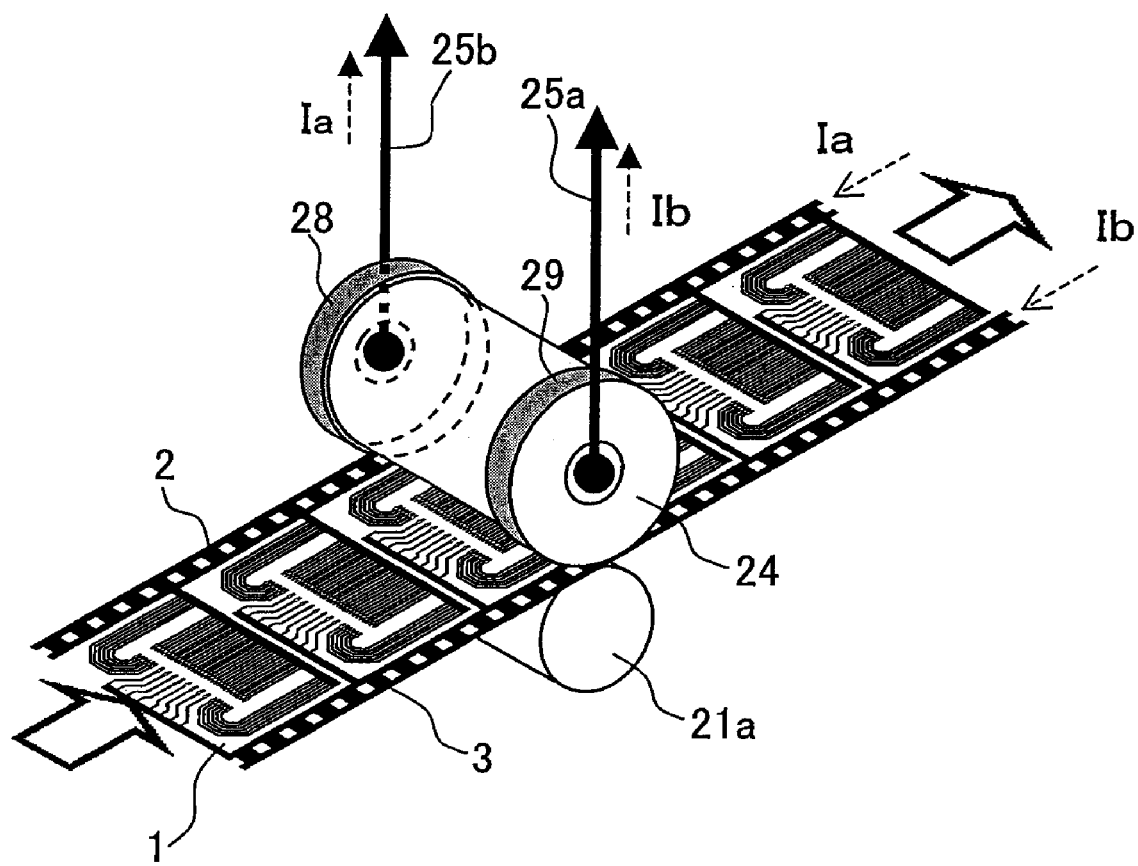
FIG. 7 is a perspective view illustrating a method of feeding a plating current for forming the protruding electrodes of the wiring board.
Figure 13:
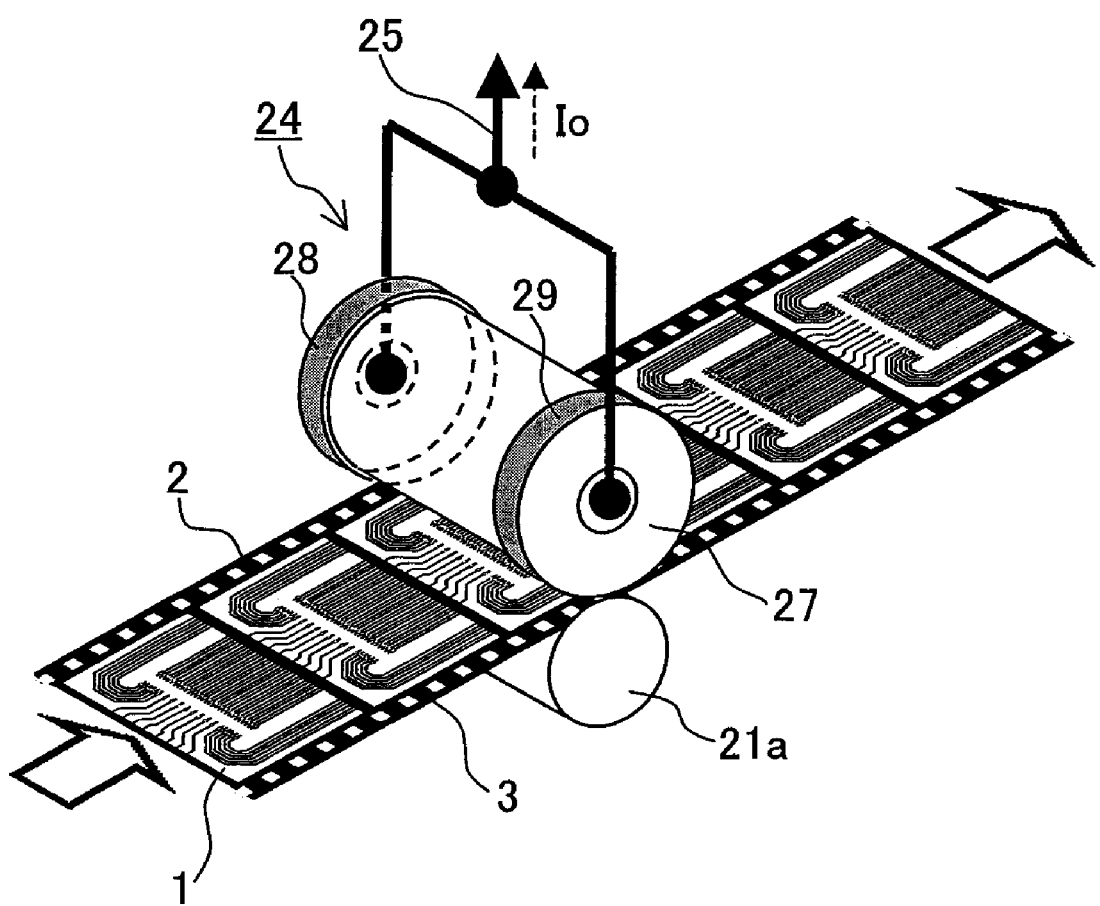
FIG. 13 is a perspective view illustrating a method for feeding a plating current for forming the protruding electrodes on the wiring board.

When the wiring board is subjected to plating, a current feeding roller as illustrated in FIG. 7 is used. The structure of this current feeding roller is basically similar to that of the current feeding roller of FIG. 13, except that first and second ring-shaped electrodes 28 and 29 are connected to plating wiring conductors 25a and 25b separated from each other. Thereby, different currents Ia and Ib can be fed separately to the first and second feeding bus lines 14 and 15 without using two anodes and two current feeding rollers as illustrated in FIG. 5A (a).

With the above-described configuration, the inner leads 6a and 12a having the dense pitch and the inner leads 8a having the sparse pitch are connected to the first and second feeding bus lines 14 and 15, respectively and separately, and in addition, the first and second feeding bus lines 14 and 15 are separated from each other, thereby making it possible to adjust the power feeding currents so that the power feeding currents fit the dense pitch and the sparse pitch, respectively. Thereby, it is possible to suppress a difference in height between the protruding electrodes formed by electrolytic plating, which otherwise is caused by a difference in pitch between the inner lead regions.

EMBODIMENT 3

Figure 8:
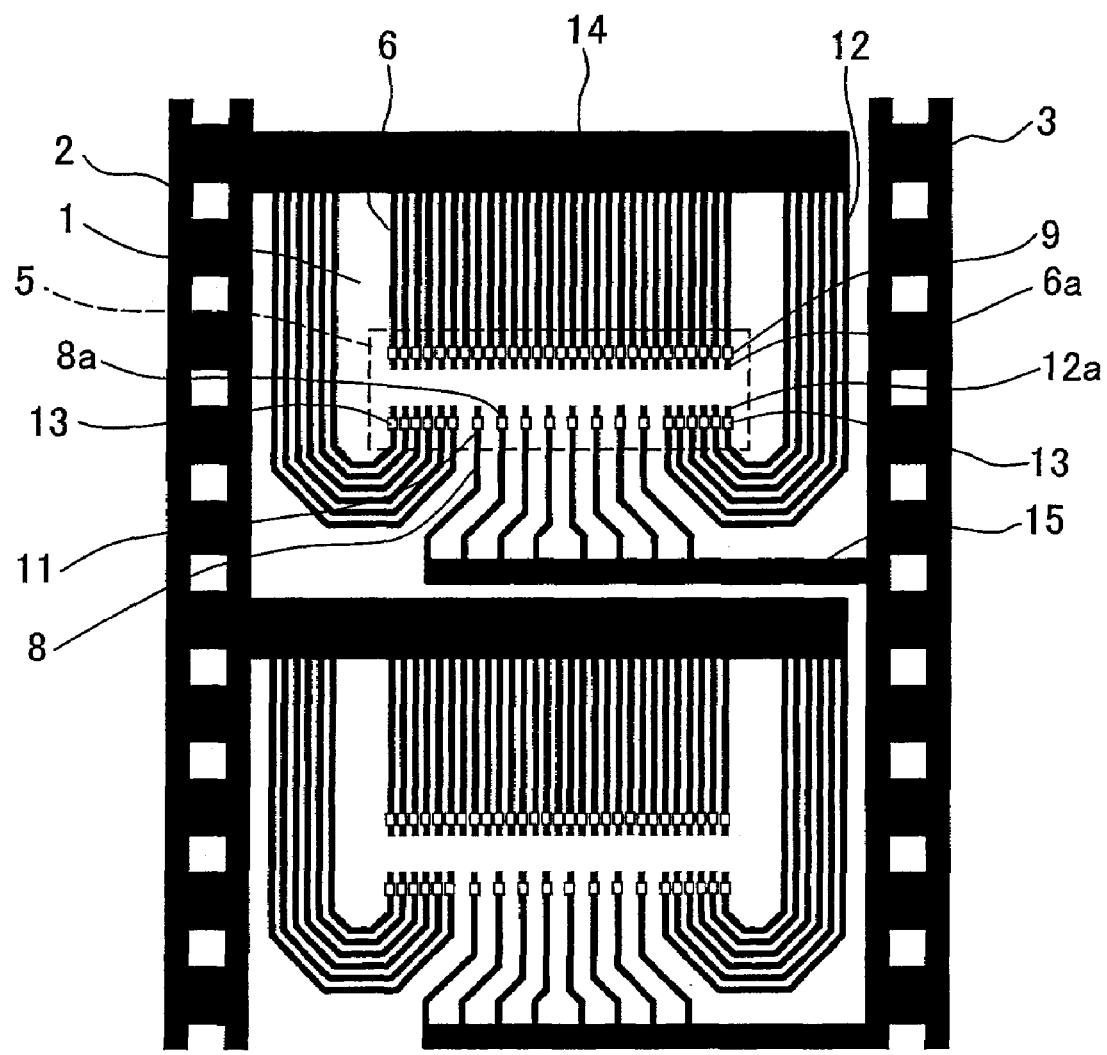
FIG. 8 is a plan view illustrating a wiring board according to Embodiment 3 of the present invention.

FIG. 8 is a plan view of a wiring board according to Embodiment 3. The same parts as those of the wiring board of Embodiment 2 of FIG. 4 are indicated by the same reference numerals and will not be described again.

In this embodiment, the first feeding bus line 14 has a width larger than that of the second feeding bus line 15, thereby making it possible readily to cause a power feeding current from the first feeding bus line 14 to be larger than a power feeding current from the second feeding bus line 15 when electrolytic plating is performed. Since the inner leads 6a and 12a having a dense wiring pitch are connected to the first feeding bus line 14 and the inner leads 8a having a sparse pitch are connected to the second feeding bus line 15, current density is caused to be uniform substantially in the entirety of a portion in which protruding electrodes are formed. Therefore, it is possible to suppress a difference in height between the protruding electrodes formed by electrolytic plating, which otherwise is caused by a difference in pitch between the inner lead regions.

In FIG. 8, although the width of the first feeding bus line 14 is set to be larger than the width of the second feeding bus line 15, in short, it is sufficient that the width of the first feeding bus line and the width of the second feeding bus line are set to differ from each other, depending on states of the conductor wirings connected to the feeding bus lines, so that the current density is caused to be uniform in the portion in which the protruding electrodes are formed.

EMBODIMENT 4

Figure 9:
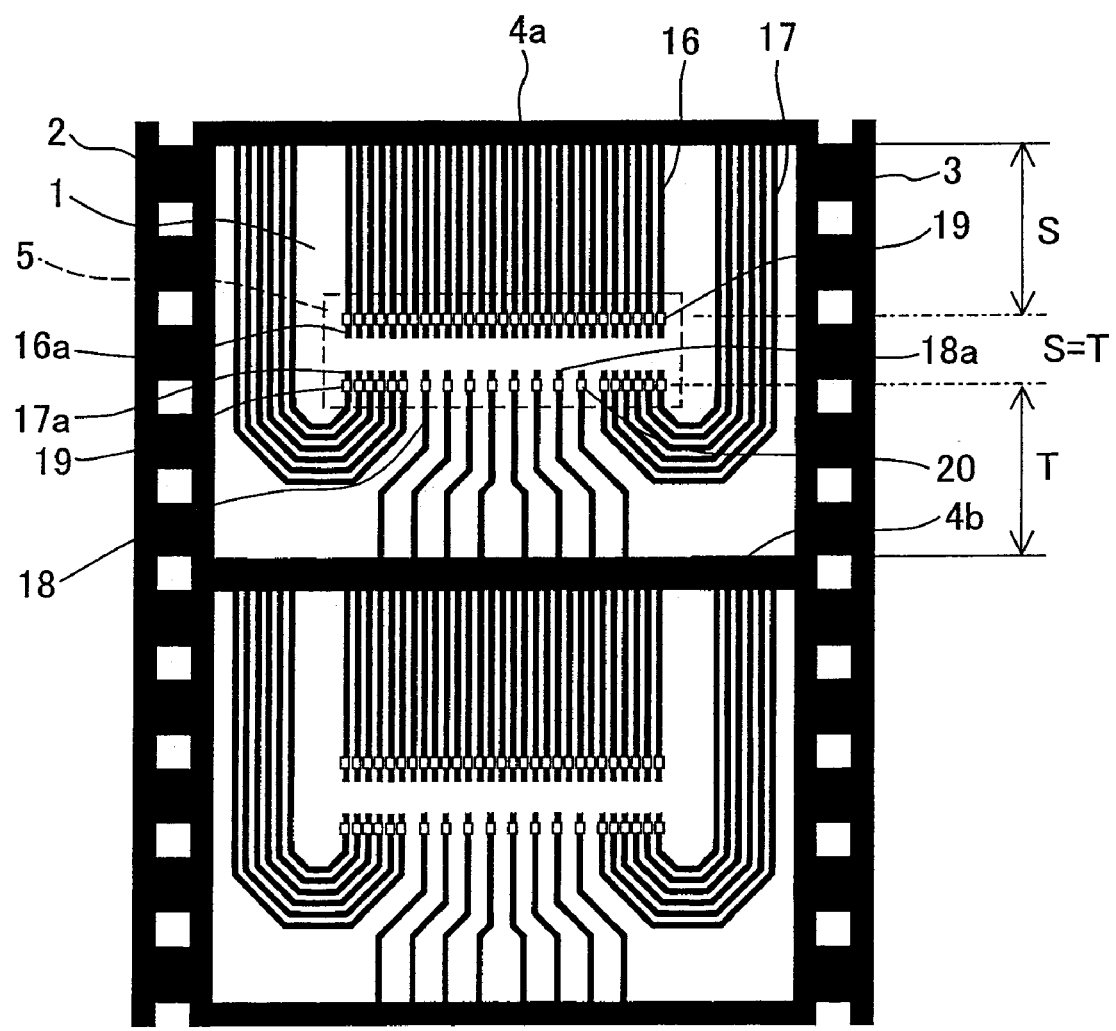
FIG. 9 is a plan view of a wiring board according to Embodiment 4 of the present invention.

FIG. 9 is a plan view of a wiring board according to Embodiment 4. The same parts as those of the wiring board of Embodiment 1 of FIG. 1 are indicated by the same reference numerals and will not be described again.

In this embodiment, a distance S from protruding electrodes 19 formed on inner leads 16a of a first group to the upper feeding bus line 4a to which conductor wirings 16 are connected, and a distance T from protruding electrodes 19 and 20 formed on inner leads 17a and 18a of a second group to the lower feeding bus line 4b, are set to be equal to each other. Thereby, lengths of the conductor wirings from the feeding bus lines 4a, 4b to the protruding electrodes 19, 20 are caused to be uniform, thereby making it easy to adjust current density.

Note that a similar configuration can be applied to Embodiments 2 and 3 of FIG. 6 and FIG. 8. Specifically, a distance from the protruding electrodes 9 formed on the inner lead 6 of the first group to the first feeding bus line 14, and a distance from the protruding electrodes 11 and 13 formed on the inner leads 8 and 12 of the second group to the second feeding bus line 15, can be set to be equal to each other.

In the wiring board of each of the above-described embodiments, the conductor wirings can be formed by etching copper foil provided on the insulating substrate. Although copper is a general material, other conductive materials can be used. The protruding electrode preferably is made of a material including, as a major component, copper, nickel, silver, gold, palladium, tin, or the like.

The invention may be embodied in other forms without departing from the gist thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A wiring board comprising:
    an insulating substrate;
    first and second feeding electrodes provided along both sides in a longitudinal direction of the insulating substrate;
    a plurality of feeding bus lines extending in a traverse direction of the insulating substrate and connected to at least one of the first and second feeding electrodes;
    a plurality of conductor wirings provided in each unit region defined by the feeding bus lines, one side terminals thereof forming inner leads and the other side terminals thereof being connected to the feeding bus lines; and
    a protruding electrode formed on each of the inner leads of the conductor wirings,
    wherein the inner leads belonging to each unit region form a first group and a second group arranged in two lines extending in the traverse direction of the insulating substrate, with tips of the inner leads of the first group and tips of the inner leads of the second group facing each other, and
    the inner leads of the first group are arranged with a dense wiring pitch, and the inner leads of the second group include a dense pitch region in which a wiring pitch thereof is the same as that of the inner leads of the first group and a sparse pitch region in which a wiring pitch thereof is longer than that of the inner leads of the first group,
    the feeding bus lines connect between the first feeding electrode and the second feeding electrode,
    the conductor wirings forming the inner leads of the first group and the inner leads in the dense pitch region of the second group are connected to the feeding bus line on one side of each unit region, and
    the conductor wirings forming the inner leads in the sparse pitch region of the second group are connected to the feeding bus line on the other side of each unit region.

2. The wiring board according to claim 1, wherein a distance from the protruding electrodes formed on the inner leads of the first group to the one feeding bus line to which the conductor wirings forming the inner leads of the first group are connected, and a distance from the protruding electrodes formed on the inner leads of the second group to the other feeding bus line, are equal to each other.

3. A wiring board comprising:
    an insulating substrate;
    first and second feeding electrodes provided along both sides in a longitudinal direction of the insulating substrate;
    a plurality of feeding bus lines extending in a traverse direction of the insulating substrate and connected to at least one of the first and second feeding electrodes;
    a plurality of conductor wirings provided in each unit region defined by the feeding bus lines, one side terminals thereof forming inner leads and the other side terminals thereof being connected to the feeding bus lines; and
    a protruding electrode formed on each of the inner leads of the conductor wirings,
    wherein the inner leads belonging to each unit region form a first group and a second group arranged in two lines extending in the traverse direction of the insulating substrate, with tips of the inner leads of the first group and tips of the inner leads of the second group facing each other, and
    the inner leads of the first group are arranged with a dense wiring pitch, and the inner leads of the second group include a dense pitch region in which a wiring pitch thereof is the same as that of the inner leads of the first group and a sparse pitch region in which a wiring pitch thereof is longer than that of the inner leads of the first group,
    the feeding bus lines include first feeding bus lines connected to the first feeding electrode and second feeding bus lines connected to the second feeding electrode, the first feeding bus lines and the second feeding bus lines being arranged alternately,
    the conductor wirings forming the inner leads of the first group and the inner leads in the dense pitch region of the second group are connected to the first feeding bus line, and
    the conductor wirings forming the inner leads in the sparse pitch region of the second group are connected to the second feeding bus line.

4. The wiring board according to claim 3, wherein the first feeding bus line has a width different from that of the second feeding bus line.

5. The wiring board according to claim 3, wherein a distance from the protruding electrodes formed on the inner leads of the first group to the first feeding bus line, and a distance from the protruding electrodes formed on the inner leads of the second group to the second feeding bus line, are equal to each other.

6. A method for producing a wiring board, comprising the steps of:
    forming first and second feeding electrodes provided along both sides in a longitudinal direction of an insulating substrate, a plurality of feeding bus lines extending in a traverse direction of the insulating substrate and connected to at least one of the first and second feeding electrodes, and a plurality of conductor wirings provided in each unit region defined by the feeding bus lines, wherein inner leads are formed with one side terminals of the conductor wirings and the other side terminals thereof are connected to the feeding bus lines so that the inner leads belonging to each unit region form a first group and a second group arranged in two lines extending in the traverse direction of the insulating substrate, with tips of the inner leads of the first group and tips of the inner leads of the second group facing each other, and the inner leads of the first group are arranged with a dense wiring pitch, and the inner leads of the second group include a dense pitch region in which a wiring pitch thereof is the same as that of the inner leads of the first group and a sparse pitch region in which a wiring pitch thereof is longer than that of the inner leads of the first group;
    forming a photoresist on the surface on which the conductor wirings are provided;
    forming an opening in the photoresist, the opening extending across the inner leads and spreading over both side areas of the inner leads, to expose a portion of the inner leads in the opening; and
    feeding a plating current to the inner leads via the feeding bus lines from the first and second feeding electrodes, to subject the exposed portion of the inner leads to electrolytic metal plating, to form protruding electrodes,
    wherein the conductor wirings forming the inner leads of the first group and the inner leads in the dense pitch region of the second group are connected to the feeding bus line on one side of each unit region, and the conductor wirings forming the inner leads in the sparse pitch region of the second group are connected to the feeding bus line on the other side of each unit region; and the plating current is supplied to the feeding bus lines through the first and second feeding electrodes from positions thereof on both sides with respect to the feeding bus lines in the longitudinal direction of the feeding electrodes.

7. A method for producing a wiring board, comprising the steps of:

forming first and second feeding electrodes provided along both sides in a longitudinal direction of an insulating substrate, a plurality of feeding bus lines extending in a traverse direction of the insulating substrate and connected to at least one of the first and second feeding electrodes, and a plurality of conductor wirings provided in each unit region defined by the feeding bus lines, wherein inner leads are formed with one side terminals of the conductor wirings and the other side terminals thereof are connected to the feeding bus lines so that the inner leads belonging to each unit region form a first group and a second group arranged in two lines extending in the traverse direction of the insulating substrate, with tips of the inner leads of the first group and tips of the inner leads of the second group facing each other, and the inner leads of the first group are arranged with a dense wiring pitch, and the inner leads of the second group include a dense pitch region in which a wiring pitch thereof is the same as that of the inner leads of the first group and a sparse pitch region in which a wiring pitch thereof is longer than that of the inner leads of the first group;

forming a photoresist on a surface on which the conductor wirings are provided;

forming an opening in the photoresist, the opening extending across the inner leads and spreading over both side areas of the inner leads, to expose a portion of the inner leads in the opening; and feeding a plating current to the inner leads via the feeding bus lines from the first and second feeding electrodes, to subject the exposed portion of the inner leads to electrolytic metal plating, to form protruding electrodes, wherein the feeding bus lines include first feeding bus lines extending in the traverse direction of the insulating substrate and connected to the first feeding electrode, and second feeding bus lines extending in the traverse direction of the insulating substrate and connected to the second feeding electrode, the first feeding bus lines and the second feeding bus lines being alternately arranged, the conductor wirings forming the inner leads of the first group and the inner leads in the dense pitch region of the second group are connected to the first feeding bus line, and the conductor wirings forming the inner leads in the sparse pitch region of the second group are connected to the second feeding bus line, and the first feeding electrode and the second feeding electrode are supplied with plating currents separately.

8. The method for producing a wiring board, according to claim 7, wherein a current feeding roller is used that has first and second ring-shaped electrodes along a circumferential surface at both end portions of an insulating roller, the first and second ring-shaped electrodes being insulated from each other, and the first ring-shaped electrode of the current feeding roller is caused to face and contact the first feeding electrode on the wiring board, and the second ring-shaped electrode of the current feeding roller is caused to face and contact the second feeding electrode on the wiring board, thereby feeding the first and second feeding electrodes with plating currents separately.

* * * * *